United States Patent
Badrudduza et al.

(10) Patent No.: US 8,638,592 B2
(45) Date of Patent: Jan. 28, 2014

(54) DUAL PORT STATIC RANDOM ACCESS MEMORY CELL

(75) Inventors: Sayeed A. Badrudduza, Austin, TX (US); Jack M. Higman, Austin, TX (US); Sanjay R. Parihar, Austin, TX (US)

(73) Assignee: Freescale Semiconductor, Inc., Austin, TX (US)

(*) Notice: Subject to any disclaimer, the term of this patent is extended or adjusted under 35 U.S.C. 154(b) by 182 days.

(21) Appl. No.: 13/228,001

(22) Filed: Sep. 8, 2011

(65) Prior Publication Data

US 2013/0064003 A1  Mar. 14, 2013

(51) Int. Cl.
*G11C 11/00* (2006.01)
(52) U.S. Cl.
USPC ....... 365/154; 365/155; 365/156; 365/230.05
(58) Field of Classification Search
USPC .............................. 365/154, 155, 156, 230.05
See application file for complete search history.

(56) References Cited

U.S. PATENT DOCUMENTS

| | | | |
|---|---|---|---|
| 7,164,596 B1* | 1/2007 | Deng et al. | 365/154 |
| 7,492,627 B2* | 2/2009 | Russell et al. | 365/154 |
| 8,009,463 B2* | 8/2011 | Liaw | 365/154 |
| 8,144,540 B2* | 3/2012 | Liaw | 365/230.05 |
| 8,189,368 B2* | 5/2012 | Liaw | 365/154 |
| 2008/0197419 A1 | 8/2008 | Liaw | |

OTHER PUBLICATIONS

U.S. Appl. No. 12/899,663, Inventor Pierre Malinge, et al, Dual Port Static Random Access Memory Cell Layout, filed Oct. 7, 2010.

* cited by examiner

*Primary Examiner* — Pho M Luu
(74) *Attorney, Agent, or Firm* — James L. Clingan, Jr.; David G. Dolezal (57) ABSTRACT

An SRAM has at least two sets of pass transistors for coupling at least two sets of bit lines to true and complement data nodes of an SRAM cell based on the assertion of at least two word lines. The cell includes two pull up transistors and two pull down transistors coupled to the true and complement data nodes. None of the pass transistors are implemented in an active area that includes a pull up transistor or a pull down transistor of the cell.

16 Claims, 6 Drawing Sheets

DUAL PORT STATIC RANDOM ACCESS MEMORY CELL

BACKGROUND

1. Field

This disclosure relates generally to memories, and more specifically, to dual port static random access memories.

2. Related Art

Dual port static random access memories (SRAMs) have common usage in a number of applications because of two independent addressing schemes for each cell so that two memory locations can be independently accessed and a single memory location can be read and written at very nearly the same time. The timing of such operations may be critical and result in issues relating to timing and speed of operation. The issues relating to this can be critical in the operation and overall utility of the dual port SRAM. The speed is important but such speed must also be accompanied by reliability. In achieving this, many considerations are included in the design. An important component of the design is the layout design of the individual memory cells that establishes the framework of the circuit design and consequent speed and reliability of the dual port SRAM.

Accordingly, there is a continuing need for enhancements in layout design that aid in speed and reliability of operation of a dual port SRAM.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

A dual port static random access memory (SRAM) has a layout that results in the pass gates that are enabled together being symmetrical in relation to a circuit path from storage nodes to the bit lines through the pass gates. The pass gates are in different active regions from active regions that have the pull-down transistors. An active region is a continuous region of semiconductor material that is, from a top view, surrounded by isolation. Each path of the circuit path is between a storage node and a doped region of a pass transistor through only metal. Having the pass gates in different active regions from the pull-down transistors is useful in achieving this result and also allows active regions of the pass gates to be shaped to optimize the pass gates rather than having to be compromised relative to the pull-down transistors. Also the active regions of the pull-down transistors can help shield the pass gate active regions from effects of the doping of the active regions of the pull-up transistors. This is better understood by reference to the drawings and the following written description.

A semiconductor substrate used for memory cell herein can be any semiconductor material or combinations of materials, such as gallium arsenide, silicon germanium, silicon-on-insulator (SOI), silicon, monocrystalline silicon, the like, and combinations of the above.

Figure 1:
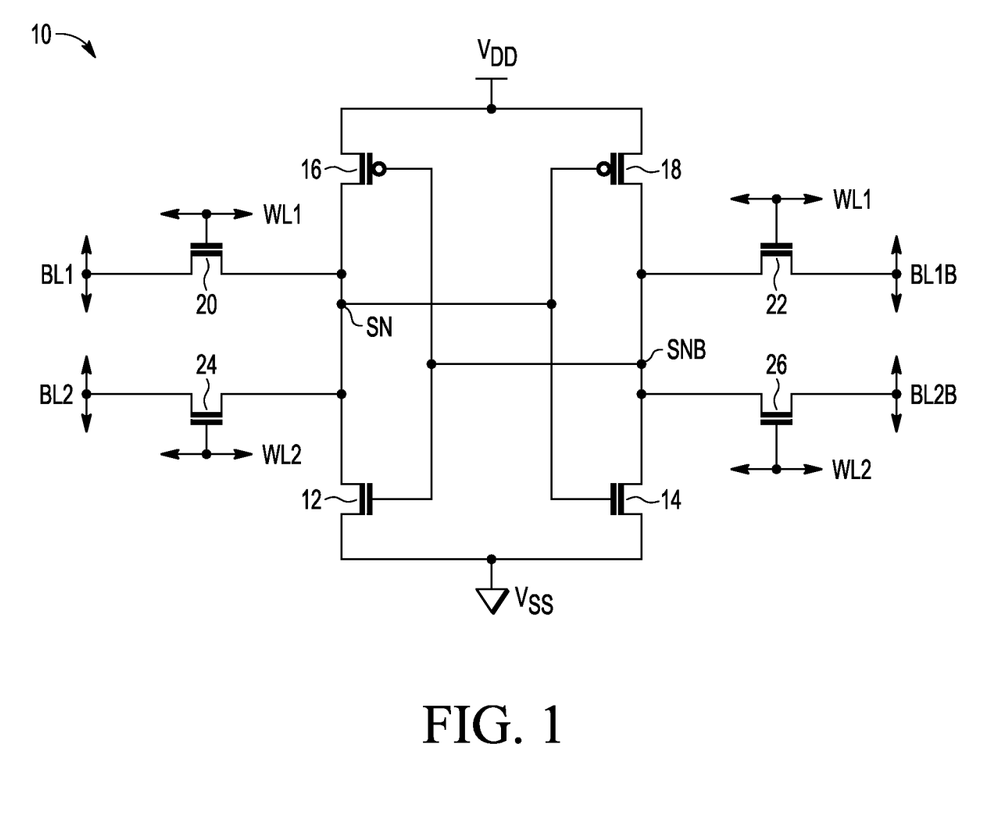
FIG. 1 is a circuit diagram of a memory cell that is to be achieved by a layout.

Shown in FIG. 1 is a circuit diagram of a memory cell 10 that is useful as a dual port SRAM cell resulting from the layout shown in FIGS. 2-6. Memory cell 10 comprises an N channel transistor 12, an N channel transistor 14, a P channel transistor 16, a P channel transistor 18, an N channel transistor 20, an N channel transistor 22, an N channel transistor 24, and an N channel transistor 26. Transistors 12 and 14 may be called pull-down transistors. Transistors 16 and 18 may be called pull-up transistors. Transistors 20, 22, 24, and 26 may be called pass transistors. Transistors 12 and 14 each have a source connected to VSS which may be ground, a drain, and a gate. Transistors 16 and 18 each have a source connected to a positive power supply terminal VDD, a gate, and a drain. The gate of transistor 12 is connected to the gate of transistor 16 and the drains of transistors 14 and 18. The gate of transistor 14 is connected to the gate of transistor 18 and the drains of transistors 12 and 16. The connection of the gates of transistors 14 and 18 and drains of transistors 12 and 16 may be called a storage node SN as shown in FIG. 1. The connection of the gates of transistors 12 and 16 and drains of transistors 14 and 18 may be called a storage node bar SNB as shown in FIG. 1 which stores data complementary to that stored at storage node SN. Pass transistors 20, 22, 24, and 26 each have a pair of source/drains and a gate. The gates of transistors 20 and 22 are coupled to a word line WL1. The gates of transistors 24 and 26 are coupled to a word line WL2. A first source/drain of transistor 20 is connected to a bit line BL1, and a second source/drain of transistor is connected to storage node SN. A first source/drain of transistor 22 is connected to a bit line bar BL1B, and a second source/drain of transistor is connected to storage node bar SNB. A first source/drain of transistor 24 is connected to a bit line BL2, and a second source/drain of transistor is connected to storage node SN. A first source/drain of transistor 26 is connected to a bit line bar BL2B, and a second source/drain of transistor is connected to storage node bar SNB. In operation, memory cell 10 may be written to or read from bit line pair BL1 and BL1B when pass gates 20 and 22 are enabled by word line WL1 being a logic high. Memory cell 10 may written to or read from bit line pair BL2 and BL2B when pass gates 24 and 26 are enabled by word line WL2 being a logic high.

Figure 2:
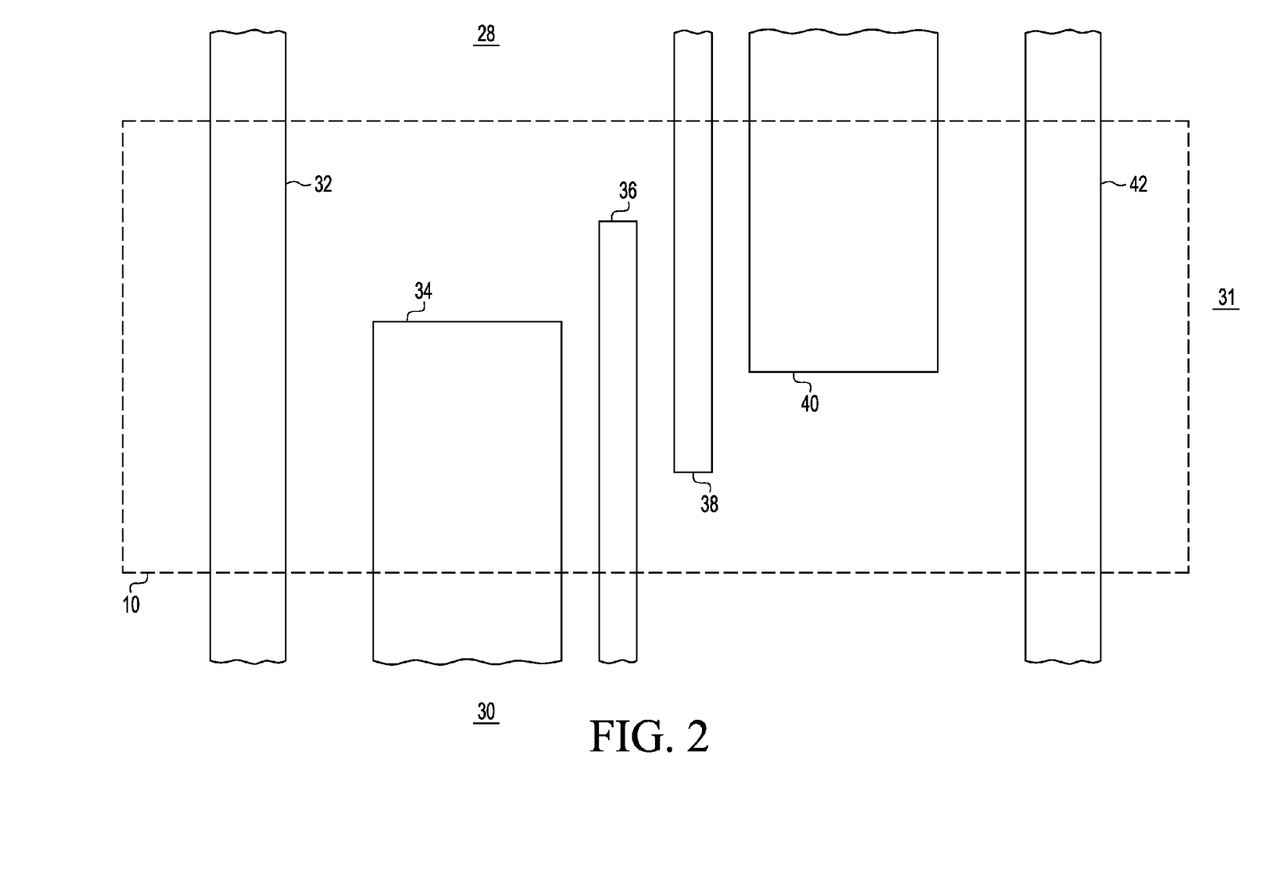
FIG. 2 is a top view of the memory cell of FIG. 1 at a stage in forming the layout.

Shown in FIG. 2 is a top view of memory cell 10 at a stage in processing in which active regions 32, 34, 36, 38, 40, and 42 have been formed. A boundary of memory cell 10 is shown with dotted lines. On a top side of memory cell 10 and adjoining memory cell 10 at its top boundary is memory cell 28, on right side of memory cell 10 at its right boundary is a memory cell 31, and below memory cell 10 on its lower boundary is a memory cell 30. Active region 32 extends into and through memory cells 28 and 30. Active region 32 has a width which may be about 100 nanometers. This width will vary with a particular process technology used for making memory cell 10. Active region 34 is spaced laterally to the right from active region 32 about the same amount as the width of active region 32. Active region 34 extends downward partially into memory cell 30 and upward about halfway through memory cell 10. Active region 36 is spaced laterally from active region 34 about the same as its width which is about half that of active region 32. Active region 36 extends downward partially into memory cell 30 and upward past active region 34 to a location that is about the same amount past active region 34 as an amount remaining to reach memory cell 28. A line extending halfway between active regions 36 and 38 divides memory cell 10 in half. Active region 38 is spaced laterally to the right from active region 36 by an amount substantially the same as active region 34 is spaced from active region 36. Active region 38 is analogous to active region 36 and has the same length and width. Active region 38 extends upward into memory cell 28 and downward toward memory cell and is about the same distance from the lower boundary of memory cell 10 as active region 36 is from the upper boundary of memory cell 10. Active region 40 is analogous to active region 34 and has the same length and width. Active region 40 is spaced from active region 38 by about the same as active region 34 is spaced from active region 36. A distance from the bottom side of active region 40 to the lower boundary of memory cell 10 is about the same as the distance from the top side of active region 34 to the top boundary of memory cell 10. Active region 42 is spaced laterally to the right of active region 40 by an amount about the same as active region 32 is spaced from active region 34. Active region 42 is analogous to active region 32. Active region 42 has a width about the same as active region 32 and extends into and through memory cell 28 and downward and through memory cell 30. Active regions 32 and 42 are rectangular within memory cell 10 with the top side boundary of memory cell 10 as the top boundaries of active regions 32 and 42 and the bottom side boundary of memory cell 10 as the lower boundaries of active regions 32 and 42. Active region 42 is spaced from the right side boundary of memory cell about the same as active region 32 is from the left side boundary of memory cell 10. Pass gates 20 and 24 are to be formed in active region 32. Pass gates 22 and 26 are to formed in active region 42. Pull-down transistor 12 is to be formed in active region 34. Pull-down transistor 14 is to be formed in active region 40. Pull-up transistor 16 is to be formed in active region 36. Pull-up transistor 18 is to be formed in active region 38.

Figure 3:
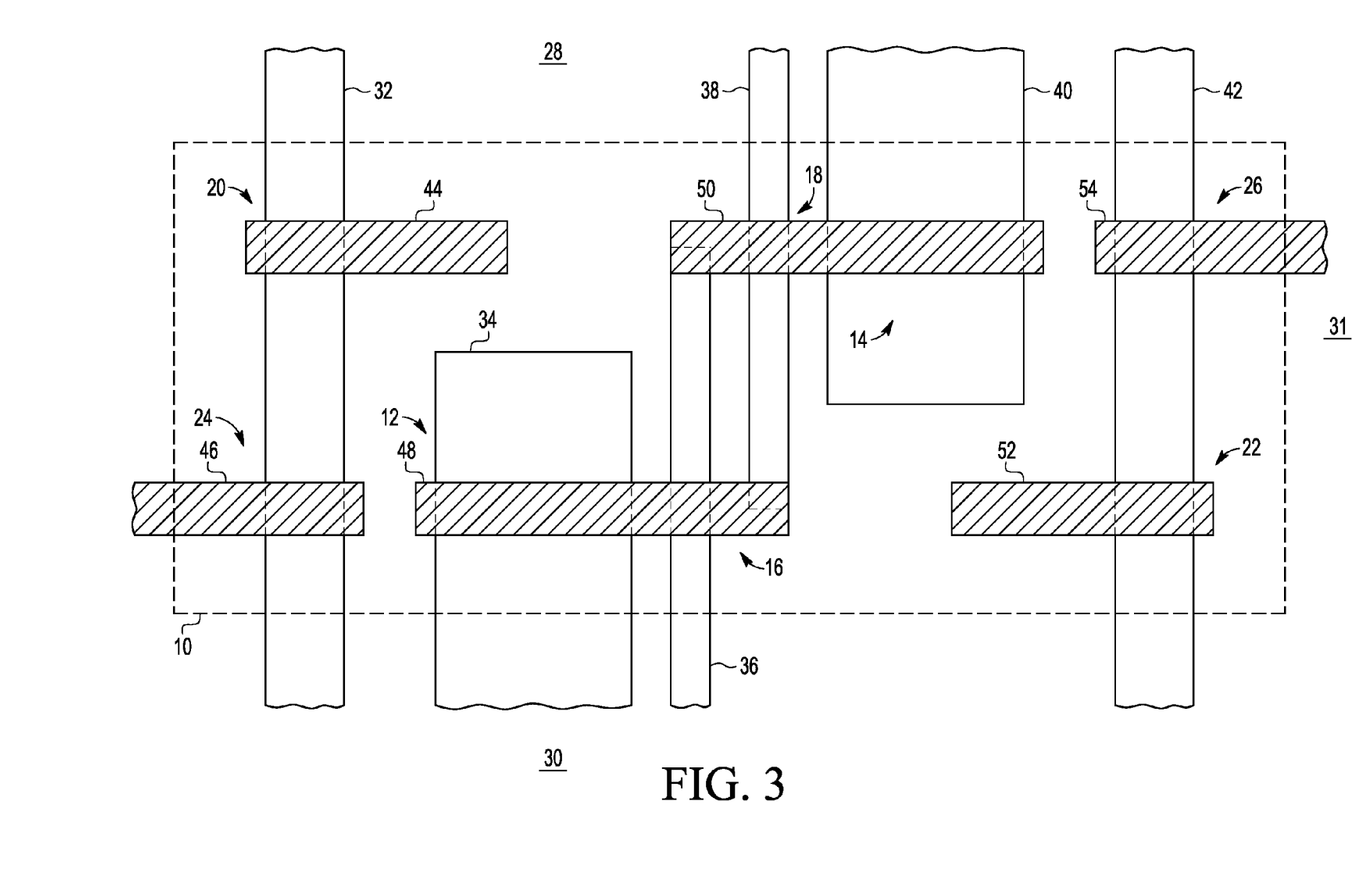
FIG. 3 is a top view of the memory cell of FIG. 1 at a stage in forming the layout subsequent to that shown in FIG. 2.

Shown in FIG. 3 is memory cell 10 after formation of transistors 12, 14, 16, 18, 20, 22, 24 and 26 by forming polysilicon lines and performing implants so that the polysilicon lines form gates with source and drains formed by implants adjacent to the gates in the active regions crossed by the polysilicon lines. Active regions 32, 34, 40, and 42 have a background well doping of P type for forming N channel transistors. Active regions 36 and 38 have a background well doping of N type for forming P channel transistors. Polysilicon line 44 is formed laterally across an upper portion of active region 32 and is the gate of transistor 20. Polysilicon line 46 is formed laterally across a lower portion of active region 32 and is the gate of transistor 24. Polysilicon line 48 laterally crosses active region 34 and active region 36 to form transistor 12 in active region 34 and transistor 16 in active region 36. Polysilicon line 48 also extends to be over a portion of the lower end of active region 38 at which will be formed a contact between the gate of transistor 16 and the drain of transistor 18. Pass gate transistor 20 as the pass transistor that couples storage node SN to bit line BL1 may be called a true pass transistor and pass gate 22 as the pass transistor that couples storage node bar SNB to bit line bar BL1B may be called a complementary pass transistor. Similarly, pass gate transistor 24 may be called a true pass transistor and pass gate transistor 26 may be called a complementary pass transistor.

Figure 4:
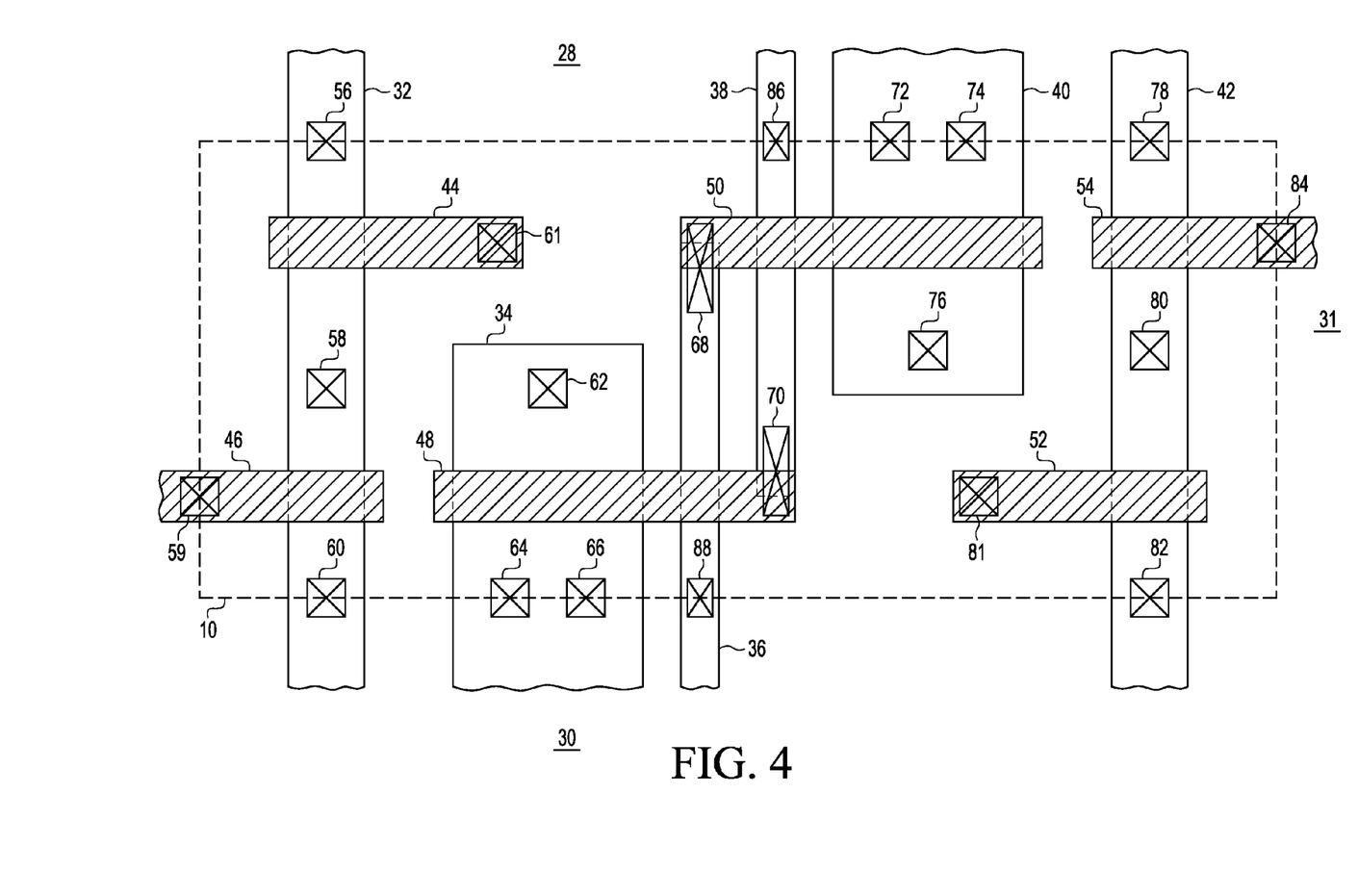
FIG. 4 is a top view of the memory cell of FIG. 1 at a stage in forming the layout subsequent to that shown in FIG. 3.

Shown in FIG. 4 is memory cell 10 after forming contacts 56, 58, 59, 60, 61, 62, 64, 66, 68, 70, 72, 74, 76, 78, 80, 81, 82, 84, 86, and 88 that are for contacting an active region with polysilicon, an active region with first metal which will be subsequently formed, polysilicon with first metal, or an active region with both polysilicon and first metal. First metal is the first metal layer deposited. Contact 56 is formed on active region 32 at the upper boundary of memory cell 10 so that it is partly in memory cell 10 and partly in memory cell 28. Contact 56 is for contacting first metal. Contact 58 is on active region 32, between polysilicon lines 44 and 46, and for contacting first metal. Contact 59 is on polysilicon line 46 at the left boundary of memory cell 10 and is for contacting first metal. Contact 60 is on active region 32 and on the boundary between memory cell 10 and memory cell 30. Contact 61 is on the right end of polysilicon line 44 and is for contacting first metal. Contact 62 is on active region 34 above polysilicon line 48 and is for contacting first metal. Contacts 64 and 66 are on active region 34 at the lower boundary of memory cell 10. Contact 68 is where polsilicon line 50 and active region 36 overlap at the top of active region 36 and the left end of polysilicon line 50 and is for contacting polysilicon line 50 to active region 36 and also to first metal. Contact 70 is where polysilicon line 48 and active region 38 overlap at the bottom of active region 38 and the right end of polysilicon line 48 and is for contacting polysilicon line 48 to active region 38 and also to first metal. Contacts 72 and 74 are on active region 40 and on the upper boundary of memory cell 10. Contact 76 is on active region 40 below polysilicon line 50 and is for contacting first metal. Contact 78 is on active region 42 at the upper boundary of memory cell 10 and is for contacting first metal. Contact 80 is on active region 42 and between polysilicon lines 54 and 52. Contact 82 is the lower boundary of memory cell 10 and is for contacting first metal. Contact 84 is on polysilicon line 54 at the right boundary of memory cell 10 and is for contacting first metal. Contact 86 is on active region 38 at the upper boundary of memory cell 10 and is for contacting first metal. Contact 88 is on active region 36 at the lower boundary of memory cell 10 and is for contacting first metal.

Figure 5:
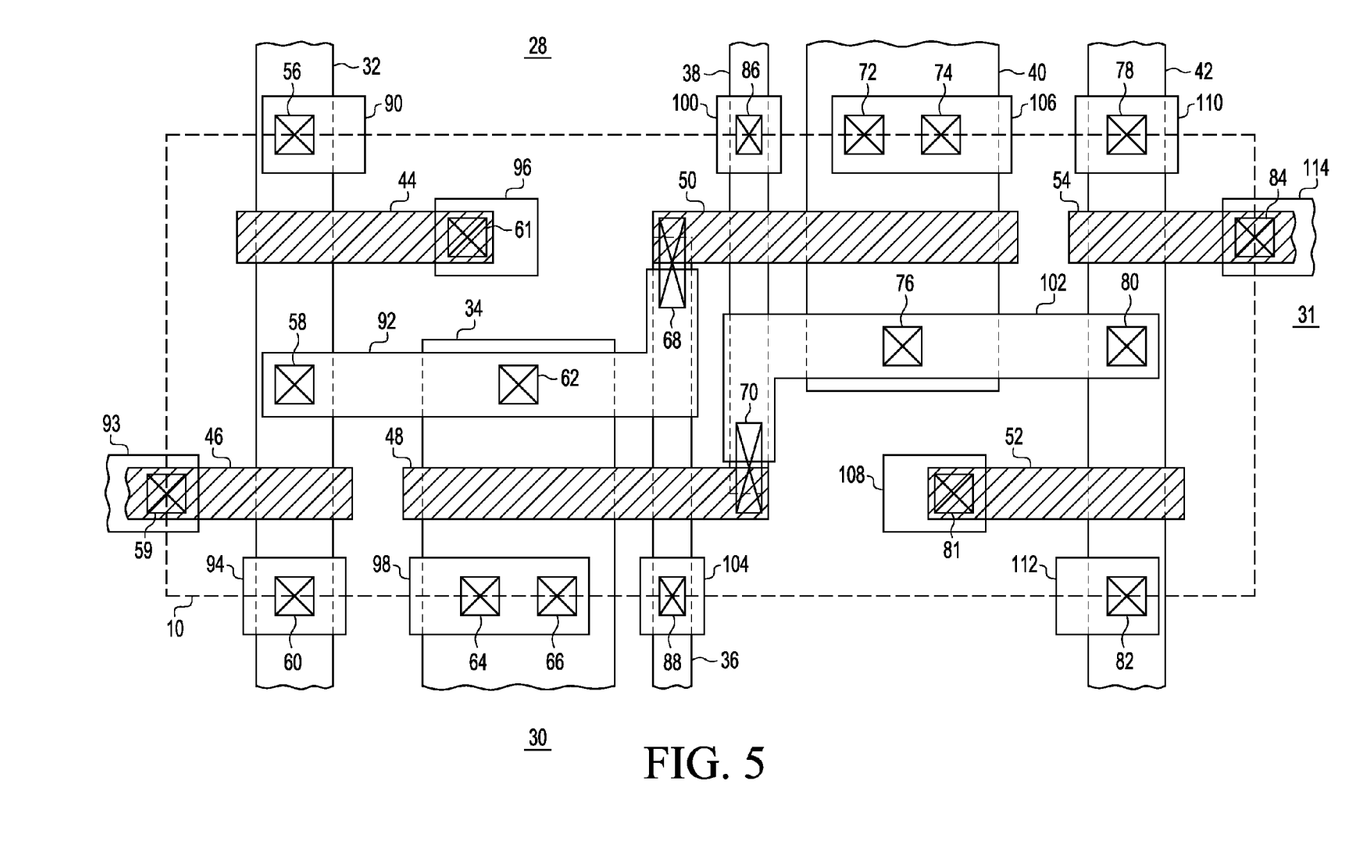
FIG. 5 is a top view of the memory cell of FIG. 1 at a stage in forming the layout subsequent to that shown in FIG. 5.
Figure 6:
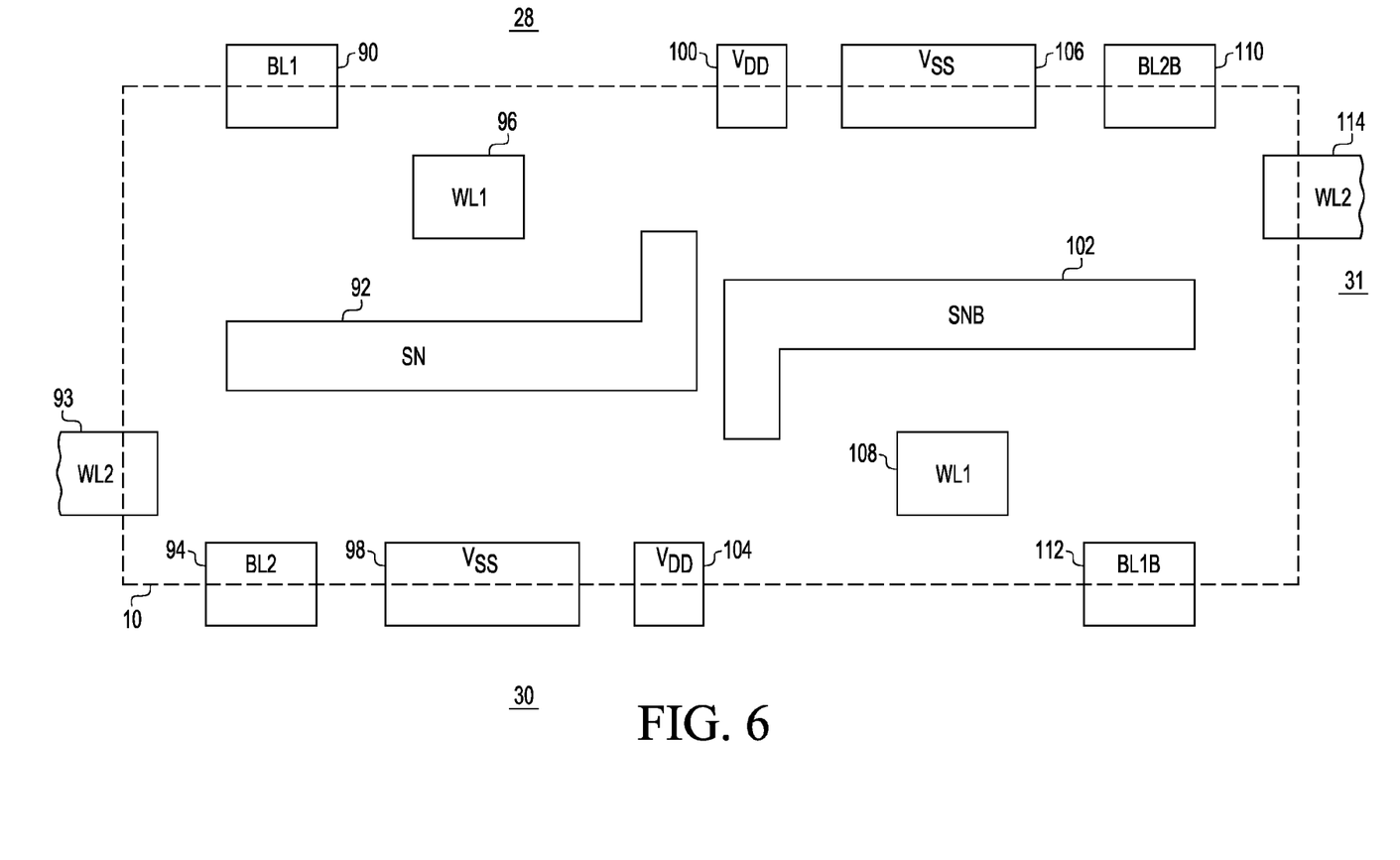
FIG. 6 is a simplified view of the layout at the stage shown in FIG. 5.

Shown in FIG. 5 is memory cell 10 after depositing a metal layer, which in this example is the first metal layer to be deposited, and patterning the metal layer to result in portions of metal that are in contact with the contacts shown in FIG. 4. These portions are useful in providing connections that form connection points shown in FIG. 1 or provide contact points that may be called landing pads for other metal lines to be formed in subsequent metal layers such as metal two and metal three. Thus, the variations of first metal may also be called interconnects. Shown in FIG. 6 is just the remaining first metal to simplify the drawing and to show the correspondence to various contact points and functionality for memory 10 as shown in FIG. 1.

The result of the deposition and patterning of the first metal layer is a first metal 90, a first metal 92, a first metal 93, a first metal 94, a first metal 96, a first metal 98, a first metal 100, a first metal 102, a first metal 104, a first metal 106, a first metal 108, a first metal 110, a first metal 112, and a first metal 114. First metal 90 is in contact with contact 56 as shown in FIG. 5 and forms a landing pad for bit line BL1 as shown in FIG. 6. First metal 92 is contact with contacts 58, 62, and 68 as shown in FIG. 5 and forms storage node SN as shown in FIG. 6. Being connected to three contacts, contacts 58, 62, and 68, it is particularly apparent that first metal 92 is being used as an interconnect. First metal 93 is in contact with contact 59 as shown in FIG. 5 and is a landing pad for word line WL2 as shown in FIG. 6. First metal 94 is in contact with contact 60 as shown in FIG. 5 and is a landing pad for bit line BL2 as shown in FIG. 6. First metal 96 is contact with contact 61 as shown in FIG. 5 and is a landing pad for word line WL1 as shown in FIG. 6. First metal 98 is in contact with contacts 64 and 66 as shown in FIG. 5 and is a landing pad for VSS as shown in FIG. 6. First metal 100 is in contact with contact 86 as shown in FIG. 5 and is a landing pad for VDD as shown in FIG. 6. First metal 102 is in contact with contacts 70, 76, and 80 as shown in FIG. 5 and forms storage node bar SNB as shown in FIG. 6. Similar to first metal 92, first metal 102 functions as an interconnect to connect contacts 70, 76, and 80. First metal 104 is in contact with contact 88 as shown in FIG. 5 and is a landing pad for VDD as shown in FIG. 6. First metal 106 is in contact with contacts 72 and 74 as shown in FIG. 5 and is a landing pad for VSS as shown in FIG. 6. First metal 108 is in contact with contact 81 as shown in FIG. 5 and forms a landing pad for word line WL1 as shown in FIG. 6. First metal 110 is in contact with contact 78 as shown in FIG. 5 and is a landing pad for bit line BL2B as shown in FIG. 6. First metal 112 is in contact with contact 82 as shown in FIG. 5 and is a landing pad for bit line bar BL1B as shown in FIG. 6. First metal 114 is in contact with contact 84 as shown in FIG. 5 and is a landing pad for word line WL2 as shown in FIG. 6.

Metal two can be used for the long bit lines and metal three can be used for the long word lines of an array of which memory cell 10 is a part. The long bit lines would run up and down and the word lines from left to right. The landing pads in first metal can be offset as needed in metal two or a combination of metal two and metal three to enable the correct connections to the long bit lines and word lines. This type of offsetting is well understood in the art.

The resulting layout is beneficial in that the pass transistors that are active at the same time are symmetrical in their layout and are connected to the appropriate storage node through metal only. This reduces variation in resistance from the storage node to the bit line.

The pass gates, being in separate active regions from the pull-down transistors, are also more consistent in their resistance. The pull-down transistors typically have a larger channel width than do the pass transistors so the active region changes shape for the transition from pass gate to pull-down transistor which results in greater variation in both the pull-down and pass gate transistors over process variations. The channel width of the pass gate transistors is set by the width of the active regions they are in and as shown in FIGS. 2-5, the active regions that have the pass gate transistors do not have a variation in width. Although the active regions do not terminate at the memory cell boundary, the active regions that have the pass gates are rectangular when the boundary of the memory cell is considered to be boundary of the active region. In fact all of the active regions of the memory cell are rectangular when viewed within the confines of the memory cell. This can also be stated that the width of the active regions do not change within the confines of the memory cell. Thus, all transistors formed within a particular active region in a memory cell have the same channel width. Accordingly, the result is a high level of symmetry for each memory cell, low resistance from the pass gate to the storage nodes, and low variation in the pass gates while retaining a cell arrangement that provides for conveniently making the memory cell part of an array of memory cells.

By now it should be appreciated that there has been provided a multi-port SRAM that has a first set of bit lines, the first set of bit lines including a first true bit line and a first complementary bit line. The multi-port SRAM further includes a second set of bit lines including a second true bit line and a second complementary bit line. The multi-port SRAM further includes a data node and a complementary data node. The multi-port SRAM further includes a first set of pass transistors including a first true pass transistor and a first complementary pass transistor, the first true pass transistor for coupling the first true bit line to the data node in response to an assertion of a first word line and the first complementary pass transistor for coupling the first complementary bit line to the complementary data node in response to an assertion of the first word line. The multi-port SRAM further includes a second set of pass transistors including a second true pass transistor and a second complementary pass transistor, the second true pass transistor for coupling the second true bit line to the data node in response to an assertion of a second word line and the second complementary pass transistor for coupling the second complementary bit line to the complementary data node in response to an assertion of the second word line. The multi-port SRAM further includes a first pull up transistor including a first current terminal coupled to a first voltage terminal, a second current terminal coupled to the data node, and a control terminal coupled to the complementary data node. The multi-port SRAM further includes a second pull up transistor including a first current terminal coupled to the first voltage terminal, a second current terminal coupled to the complementary data node, and a control terminal coupled to the data node. The multi-port SRAM further includes a first pull down transistor including a first current terminal coupled to a second voltage terminal, a second current terminal coupled to the data node, and a control terminal coupled to the complementary data node. The multi-port SRAM further includes a second pull down transistor including a first current terminal coupled to the second voltage terminal, a second current terminal coupled to the complementary data node, and a control terminal coupled to the data node. The multi-port SRAM has a further characterization by which the first true pass transistor is implemented in an active region that does not include the first pull up transistor, the second pull up transistor, the first pull down transistor, and the second pull down transistor. The multi-port SRAM has a further characterization by which the first complementary pass transistor is implemented in an active region that does not include the first pull up transistor, the second pull up transistor, the first pull down transistor, and the second pull down transistor. The multi-port SRAM has a further characterization by which the second true pass transistor is implemented in an active region that does not include the first pull up transistor, the second pull up transistor, the first pull down transistor, and the second pull down transistor. The multi-port SRAM has a further characterization by which the second complementary pass transistor is implemented in an active region that does not include the first pull up transistor, the second pull up transistor, the first pull down transistor, and the second pull down transistor. The multi-port SRAM may have a further characterization by which the first true pass transistor is located in the same active region as the second true pass transistor and the first complementary pass transistor is located in the same active region as the second complementary pass transistor. The multi-port SRAM may have a further characterization by which the first true pass transistor and the second true pass transistor are located in a first active region and the first complementary pass transistor and the second complementary pass transistor are located in a second active region. The multi-port SRAM may have a further characterization by which the first pull up transistor, the second pull up transistor, the first pull down transistor and the second pull down transistor are located in active regions of a substrate between the first active region and the second active region. The multi-port SRAM may have a further characterization by which the first true pass transistor is located in a different active region than the first complementary pass transistor and wherein the second true pass transistor is located in a different active region than the second complementary pass transistor. The multi-port SRAM may have a further characterization by which the second true pass transistor is located in a first active region, the first pull down transistor is located in a second active region, and first pull up transistor is located in a third active region, wherein the second active region is located between the first active region and the third active region on a substrate. The multi-port SRAM may have a further characterization by which the second complementary pass transistor is located in a fourth active region, the second pull down transistor is located in a fifth active region, and second pull up transistor is located in a sixth active region, wherein the fifth active region is located between the fourth active region, and the sixth active region on the substrate. The multi-port SRAM may have a further characterization by which the first and fourth active regions occupy the same amount of substrate area, the second and fifth active regions occupy the same amount of substrate area, and the third and sixth active regions occupy the same amount of substrate area. The multi-port SRAM may have a further characterization by which a first interconnect located over a substrate, the first interconnect coupling a current terminal of the first true pass transistor and a current terminal of the second true pass transistor to the second current terminal of the first pull down transistor and the second current terminal of the first pull up transistor and a second interconnect located over a substrate, the second interconnect coupling a current terminal of the first complementary pass transistor and a current terminal of the second complementary pass transistor to the second current terminal of the second pull down transistor and the second current terminal of the second pull up transistor. The multi-port SRAM may have a further characterization by which the first interconnect has the same size and shape as the second interconnect. The multi-port SRAM may have a further characterization by which the first pull down transistor is implemented in an active region that does not include the first pull up transistor, the second pull up transistor, the first true pass transistor, the second true pass transistor, the second pull down transistor, the first complementary pass transistor, and the second complementary pass transistor. The multi-port SRAM may have a further characterization by which the first pull up transistor, the second pull up transistor, the first true pass transistor, the second true pass transistor, the first pull down transistor, the second pull down transistor, the first complementary pass transistors, and the second complementary pass transistor are of a first cell of the multi-port SRAM, wherein the SRAM includes a plurality of cells arranged in columns wherein the plurality of cells have the same circuit configuration as the first cell, the first cell is located in a first column of cells of the plurality of columns, the first true pass transistor and the second true pass transistor of each cell of the first column is located in a first active region, and the first complementary pass transistor and the second complementary pass transistor of each cell of the first column is located in a second active region. The multi-port SRAM may have a further characterization by which the first pull down transistor of the first cell is located in a third active region, wherein only one other pull down transistor of a cell of the first column is located in the third active region and the second pull down transistor of the first cell is located in a fourth active region, wherein only one other pull down transistor of a cell of the first column is located in the fourth active region. The multi-port SRAM may have a further characterization by which the first pull up transistor of the first cell is located in a third active region, wherein only one other pull up transistor of a cell of the first column is located in the third active region and the second pull up transistor of the first cell is located in a fourth active region, wherein only one other pull up transistor of a cell of the first column is located in the fourth active region. The multi-port SRAM may have a further characterization by which the first pull up transistor, the second pull up transistor, the first true pass transistor, the second true pass transistor, the first pull down transistor, the second pull down transistor, the first complementary pass transistor, and the second complementary pass transistor are of a first cell of the SRAM and the first true pass transistor, the second true pass transistor, the first complementary pass transistor and the second complementary pass transistor are implemented in active regions that within a boundary of the first cell have a rectangular shape. The multi-port SRAM may have a further characterization by which the first true pass transistor and the second true pass transistor are located in a first active region and the first complementary pass transistor and the second complementary pass transistor are located in a second active region. The multi-port SRAM may have a further characterization by which the first pull up transistor, the second pull up transistor, the first true pass transistor, the second true pass transistor, the first pull down transistor, the second pull down transistor, the first complementary pass transistor, and the second complementary pass transistor are of a first cell of the SRAM and the first true pass transistor is located in a first active region and the first complementary pass transistor is located in a second active region, wherein within a boundary of the first cell, the first active region and the second active region have the same size and shape.

Also described is a method of making an SRAM including forming a first pull up transistor including a first current terminal coupled to a first voltage terminal, a second current terminal coupled to a data node, and a control terminal coupled to a complementary data node. The method further includes forming a second pull up transistor including a first current terminal coupled to the first voltage terminal, a second current terminal coupled to the complementary data node, and a control terminal coupled to the data node. The method further includes forming a first pull down transistor including a first current terminal coupled to a second voltage terminal, a second current terminal coupled to the data node, and a control terminal coupled to the complementary data node. The method further includes forming a second pull down transistor including a first current terminal coupled to the second voltage terminal, a second current terminal coupled to the complementary data node, and a control terminal coupled to the data node. The method further includes forming a first set of pass transistors including a first true pass transistor and a first complementary pass transistor, the first true pass transistor for coupling a first true bit line to the data node in response to an assertion of a first word line and the first complementary pass transistor for coupling a first complementary bit line to the complementary data node in response to an assertion of the first word line. The method further includes forming a second set of pass transistors including a second true pass transistor and a second complementary pass transistor, the second true pass transistor for coupling a second true bit line to the data node in response to an assertion of a second word line and the second complementary pass transistor for coupling a second complementary bit line to the complementary data node in response to an assertion of the second word line. The method has a further characterization by which the first true pass transistor is implemented in an active region that does not include the first pull up transistor, the second pull up transistor, the first pull down transistor, and the second pull down transistor. The method has a further characterization by which the first complementary pass transistor is implemented in an active region that does not include the first pull up transistor, the second pull up transistor, the first pull down transistor, and the second pull down transistor. The method has a further characterization by which the second true pass transistor is implemented in an active region that does not include the first pull up transistor, the second pull up transistor, the first pull down transistor, and the second pull down transistor. The method has a further characterization by which the second complementary pass transistor is implemented in an active region that does not include the first pull up transistor, the second pull up transistor, the first pull down transistor, and the second pull down transistor. The method may have a further characterization by which the first pull up transistor, the second pull up transistor, the first true pass transistor, the second true pass transistor, the first pull down transistor, the second pull down transistor, the first complementary pass transistors, and the second complementary pass transistor are of a first cell of the SRAM, and the first true pass transistor, the second true pass transistor, the first complementary pass transistor and the second complementary pass transistor are implemented in active regions that within a boundary of the first cell have a rectangular shape. The method may further include forming a first interconnect located over a substrate, the first interconnect coupling a current terminal of the first true pass transistor and a current terminal of the second true pass transistor to the second current terminal of the first pull down transistor and the second current terminal of the first pull up transistor and forming a second interconnect located over a substrate, the second interconnect coupling a current terminal of the first complementary pass transistor and a current terminal of the second complementary pass transistor to the second current terminal of the second pull down transistor and the second current terminal of the second pull up transistor, wherein the first interconnect has the same size and shape as the second interconnect.

Although the invention has been described with respect to specific conductivity types or polarity of potentials, skilled artisans appreciated that conductivity types and polarities of potentials may be reversed.

Although the invention is described herein with reference to specific embodiments, various modifications and changes can be made without departing from the scope of the present invention as set forth in the claims below. For example, the long word lines could be formed in metal two and the long bit lines formed in metal three. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A multi-port SRAM comprising:
    a first set of bit lines, the first set of bit lines including a first true bit line and a first complementary bit line;
    a second set of bit lines including a second true bit line and a second complementary bit line;
    a data node and a complementary data node;
    a first set of pass transistors including a first true pass transistor and a first complementary pass transistor, the first true pass transistor for coupling the first true bit line to the data node in response to an assertion of a first word line and the first complementary pass transistor for coupling the first complementary bit line to the complementary data node in response to an assertion of the first word line;
    a second set of pass transistors including a second true pass transistor and a second complementary pass transistor, the second true pass transistor for coupling the second true bit line to the data node in response to an assertion of a second word line and the second complementary pass transistor for coupling the second complementary bit line to the complementary data node in response to an assertion of the second word line;
    a first pull up transistor including a first current terminal coupled to a first voltage terminal, a second current terminal coupled to the data node, and a control terminal coupled to the complementary data node;
    a second pull up transistor including a first current terminal coupled to the first voltage terminal, a second current terminal coupled to the complementary data node, and a control terminal coupled to the data node;
    a first pull down transistor including a first current terminal coupled to a second voltage terminal, a second current terminal coupled to the data node, and a control terminal coupled to the complementary data node; and
    a second pull down transistor including a first current terminal coupled to the second voltage terminal, a second current terminal coupled to the complementary data node, and a control terminal coupled to the data node;
    wherein the first true pass transistor is implemented in an active region that does not include the first pull up transistor, the second pull up transistor, the first pull down transistor, and the second pull down transistor;
    wherein the first complementary pass transistor is implemented in an active region that does not include the first pull up transistor, the second pull up transistor, the first pull down transistor, and the second pull down transistor;
    wherein the second true pass transistor is implemented in an active region that does not include the first pull up transistor, the second pull up transistor, the first pull down transistor, and the second pull down transistor;
    wherein the second complementary pass transistor is implemented in an active region that does not include the first pull up transistor, the second pull up transistor, the first pull down transistor, and the second pull down transistor; and
    wherein the second true pass transistor is located in a first active region, the first pull down transistor is located in a second active region, and first pull up transistor is located in a third active region, wherein the second active region is located between the first active region and the third active region on a substrate.

2. The multi-port SRAM of claim 1 wherein the first true pass transistor is located in the same active region as the second true pass transistor and the first complementary pass transistor is located in the same active region as the second complementary pass transistor.

3. The multi-port SRAM of claim 2 wherein the first true pass transistor and the second true pass transistor are located in a first active region and the first complementary pass transistor and the second complementary pass transistor are located in a second active region.

4. The multi-port SRAM of claim 3 wherein the first pull up transistor, the second pull up transistor, the first pull down transistor and the second pull down transistor are located in active regions of a substrate between the first active region and the second active region.

5. The multi-port SRAM of claim 1 wherein the first true pass transistor is located in a different active region than the first complementary pass transistor and wherein the second true pass transistor is located in a different active region than the second complementary pass transistor.

6. The multi-port SRAM of claim 1 wherein the second complementary pass transistor is located in a fourth active region, the second pull down transistor is located in a fifth active region, and second pull up transistor is located in a sixth active region, wherein the fifth active region is located between the fourth active region, and the sixth active region on the substrate.

7. The multi-port SRAM of claim 6 wherein the first and fourth active regions occupy the same amount of substrate area, the second and fifth active regions occupy the same amount of substrate area, and the third and sixth active regions occupy the same amount of substrate area.

8. A multi-port SRAM comprising:
a first set of bit lines, the first set of bit lines including a first true bit line and a first complementary bit line;
a second set of bit lines including a second true bit line and a second complementary bit line;
a data node and a complementary data node;
a first set of pass transistors including a first true pass transistor and a first complementary pass transistor, the first true pass transistor for coupling the first true bit line to the data node in response to an assertion of a first word line and the first complementary pass transistor for coupling the first complementary bit line to the complementary data node in response to an assertion of the first word line;
a second set of pass transistors including a second true pass transistor and a second complementary pass transistor, the second true pass transistor for coupling the second true bit line to the data node in response to an assertion of a second word line and the second complementary pass transistor for coupling the second complementary bit line to the complementary data node in response to an assertion of the second word line;
a first pull up transistor including a first current terminal coupled to a first voltage terminal, a second current terminal coupled to the data node, and a control terminal coupled to the complementary data node;
a second pull up transistor including a first current terminal coupled to the first voltage terminal, a second current terminal coupled to the complementary data node, and a control terminal coupled to the data node;
a first pull down transistor including a first current terminal coupled to a second voltage terminal, a second current terminal coupled to the data node, and a control terminal coupled to the complementary data node;
a second pull down transistor including a first current terminal coupled to the second voltage terminal, a second current terminal coupled to the complementary data node, and a control terminal coupled to the data node;
a first interconnect located over a substrate, the first interconnect coupling a current terminal of the first true pass transistor and a current terminal of the second true pass transistor to the second current terminal of the first pull down transistor and the second current terminal of the first pull up transistor; and
a second interconnect located over a substrate, the second interconnect coupling a current terminal of the first complementary pass transistor and a current terminal of the second complementary pass transistor to the second current terminal of the second pull down transistor and the second current terminal of the second pull up transistor;
wherein the first true pass transistor is implemented in an active region that does not include the first pull up transistor, the second pull up transistor, the first pull down transistor, and the second pull down transistor;
wherein the first complementary pass transistor is implemented in an active region that does not include the first pull up transistor, the second pull up transistor, the first pull down transistor, and the second pull down transistor;
wherein the second true pass transistor is implemented in an active region that does not include the first pull up transistor, the second pull up transistor, the first pull down transistor, and the second pull down transistor;
wherein the second complementary pass transistor is implemented in an active region that does not include the first pull up transistor, the second pull up transistor, the first pull down transistor, and the second pull down transistor.

9. The multi-port SRAM of claim 8 wherein the first interconnect has the same size and shape as the second interconnect.

10. A multi-port SRAM comprising:
a first set of bit lines, the first set of bit lines including a first true bit line and a first complementary bit line;
a second set of bit lines including a second true bit line and a second complementary bit line;
a data node and a complementary data node;
a first set of pass transistors including a first true pass transistor and a first complementary pass transistor, the first true pass transistor for coupling the first true bit line to the data node in response to an assertion of a first word line and the first complementary pass transistor for coupling the first complementary bit line to the complementary data node in response to an assertion of the first word line;
a second set of pass transistors including a second true pass transistor and a second complementary pass transistor, the second true pass transistor for coupling the second true bit line to the data node in response to an assertion of a second word line and the second complementary pass transistor for coupling the second complementary bit line to the complementary data node in response to an assertion of the second word line;
a first pull up transistor including a first current terminal coupled to a first voltage terminal, a second current terminal coupled to the data node, and a control terminal coupled to the complementary data node;
a second pull up transistor including a first current terminal coupled to the first voltage terminal, a second current terminal coupled to the complementary data node, and a control terminal coupled to the data node;

a first pull down transistor including a first current terminal coupled to a second voltage terminal, a second current terminal coupled to the data node, and a control terminal coupled to the complementary data node; and a second pull down transistor including a first current terminal coupled to the second voltage terminal, a second current terminal coupled to the complementary data node, and a control terminal coupled to the data node;

wherein the first true pass transistor is implemented in an active region that does not include the first pull up transistor, the second pull up transistor, the first pull down transistor, and the second pull down transistor;

wherein the first complementary pass transistor is implemented in an active region that does not include the first pull up transistor, the second pull up transistor, the first pull down transistor, and the second pull down transistor;

wherein the second true pass transistor is implemented in an active region that does not include the first pull up transistor, the second pull up transistor, the first pull down transistor, and the second pull down transistor;

wherein the second complementary pass transistor is implemented in an active region that does not include the first pull up transistor, the second pull up transistor, the first pull down transistor, and the second pull down transistor; and wherein the first pull down transistor is implemented in an active region that does not include the first pull up transistor, the second pull up transistor, the first true pass transistor, the second true pass transistor, the second pull down transistor, the first complementary pass transistor, and the second complementary pass transistor.

11. A multi-port SRAM comprising:

a first set of bit lines, the first set of bit lines including a first true bit line and a first complementary bit line;

a second set of bit lines including a second true bit line and a second complementary bit line;

a data node and a complementary data node;

a first set of pass transistors including a first true pass transistor and a first complementary pass transistor, the first true pass transistor for coupling the first true bit line to the data node in response to an assertion of a first word line and the first complementary pass transistor for coupling the first complementary bit line to the complementary data node in response to an assertion of the first word line;

a second set of pass transistors including a second true pass transistor and a second complementary pass transistor, the second true pass transistor for coupling the second true bit line to the data node in response to an assertion of a second word line and the second complementary pass transistor for coupling the second complementary bit line to the complementary data node in response to an assertion of the second word line;

a first pull up transistor including a first current terminal coupled to a first voltage terminal, a second current terminal coupled to the data node, and a control terminal coupled to the complementary data node;

a second pull up transistor including a first current terminal coupled to the first voltage terminal, a second current terminal coupled to the complementary data node, and a control terminal coupled to the data node;

a first pull down transistor including a first current terminal coupled to a second voltage terminal, a second current terminal coupled to the data node, and a control terminal coupled to the complementary data node; and a second pull down transistor including a first current terminal coupled to the second voltage terminal, a second current terminal coupled to the complementary data node, and a control terminal coupled to the data node;

wherein the first true pass transistor is implemented in an active region that does not include the first pull up transistor, the second pull up transistor, the first pull down transistor, and the second pull down transistor;

wherein the first complementary pass transistor is implemented in an active region that does not include the first pull up transistor, the second pull up transistor, the first pull down transistor, and the second pull down transistor;

wherein the second true pass transistor is implemented in an active region that does not include the first pull up transistor, the second pull up transistor, the first pull down transistor, and the second pull down transistor;

wherein the second complementary pass transistor is implemented in an active region that does not include the first pull up transistor, the second pull up transistor, the first pull down transistor, and the second pull down transistor; and wherein:
the first pull up transistor, the second pull up transistor, the first true pass transistor, the second true pass transistor, the first pull down transistor, the second pull down transistor, the first complementary pass transistors, and the second complementary pass transistor are of a first cell of the multi-port SRAM, wherein the SRAM includes a plurality of cells arranged in columns wherein the plurality of cells have the same circuit configuration as the first cell;

the first cell is located in a first column of cells of the plurality of columns;

the first true pass transistor and the second true pass transistor of each cell of the first column is located in a first active region; and the first complementary pass transistor and the second complementary pass transistor of each cell of the first column is located in a second active region.

12. The multi-port SRAM of claim 11 wherein:
the first pull down transistor of the first cell is located in a third active region, wherein only one other pull down transistor of a cell of the first column is located in the third active region; and
the second pull down transistor of the first cell is located in a fourth active region, wherein only one other pull down transistor of a cell of the first column is located in the fourth active region.

13. The multi-port SRAM of claim 11 wherein:
the first pull up transistor of the first cell is located in a third active region, wherein only one other pull up transistor of a cell of the first column is located in the third active region; and
the second pull up transistor of the first cell is located in a fourth active region, wherein only one other pull up transistor of a cell of the first column is located in the fourth active region.

14. A multi-port SRAM comprising:
a first set of bit lines, the first set of bit lines including a first true bit line and a first complementary bit line;
a second set of bit lines including a second true bit line and a second complementary bit line;
a data node and a complementary data node;
a first set of pass transistors including a first true pass transistor and a first complementary pass transistor, the first true pass transistor for coupling the first true bit line to the data node in response to an assertion of a first word line and the first complementary pass transistor for coupling the first complementary bit line to the complementary data node in response to an assertion of the first word line;

a second set of pass transistors including a second true pass transistor and a second complementary pass transistor, the second true pass transistor for coupling the second true bit line to the data node in response to an assertion of a second word line and the second complementary pass transistor for coupling the second complementary bit line to the complementary data node in response to an assertion of the second word line;

a first pull up transistor including a first current terminal coupled to a first voltage terminal, a second current terminal coupled to the data node, and a control terminal coupled to the complementary data node;

a second pull up transistor including a first current terminal coupled to the first voltage terminal, a second current terminal coupled to the complementary data node, and a control terminal coupled to the data node;

a first pull down transistor including a first current terminal coupled to a second voltage terminal, a second current terminal coupled to the data node, and a control terminal coupled to the complementary data node; and a second pull down transistor including a first current terminal coupled to the second voltage terminal, a second current terminal coupled to the complementary data node, and a control terminal coupled to the data node;

wherein the first true pass transistor is implemented in an active region that does not include the first pull up transistor, the second pull up transistor, the first pull down transistor, and the second pull down transistor;

wherein the first complementary pass transistor is implemented in an active region that does not include the first pull up transistor, the second pull up transistor, the first pull down transistor, and the second pull down transistor;

wherein the second true pass transistor is implemented in an active region that does not include the first pull up transistor, the second pull up transistor, the first pull down transistor, and the second pull down transistor;

wherein the second complementary pass transistor is implemented in an active region that does not include the first pull up transistor, the second pull up transistor, the first pull down transistor, and the second pull down transistor; and wherein:
the first pull up transistor, the second pull up transistor, the first true pass transistor, the second true pass transistor, the first pull down transistor, the second pull down transistor, the first complementary pass transistor, and the second complementary pass transistor are of a first cell of the SRAM; and the first true pass transistor, the second true pass transistor, the first complementary pass transistor and the second complementary pass transistor are implemented in active regions that within a boundary of the first cell have a rectangular shape.

15. The multi-port SRAM of claim 14 wherein the first true pass transistor and the second true pass transistor are located in a first active region and the first complementary pass transistor and the second complementary pass transistor are located in a second active region.

16. A multi-port SRAM comprising:
a first set of bit lines, the first set of bit lines including a first true bit line and a first complementary bit line;

a second set of bit lines including a second true bit line and a second complementary bit line;

a data node and a complementary data node;

a first set of pass transistors including a first true pass transistor and a first complementary pass transistor, the first true pass transistor for coupling the first true bit line to the data node in response to an assertion of a first word line and the first complementary pass transistor for coupling the first complementary bit line to the complementary data node in response to an assertion of the first word line;

a second set of pass transistors including a second true pass transistor and a second complementary pass transistor, the second true pass transistor for coupling the second true bit line to the data node in response to an assertion of a second word line and the second complementary pass transistor for coupling the second complementary bit line to the complementary data node in response to an assertion of the second word line;

a first pull up transistor including a first current terminal coupled to a first voltage terminal, a second current terminal coupled to the data node, and a control terminal coupled to the complementary data node;

a second pull up transistor including a first current terminal coupled to the first voltage terminal, a second current terminal coupled to the complementary data node, and a control terminal coupled to the data node;

a first pull down transistor including a first current terminal coupled to a second voltage terminal, a second current terminal coupled to the data node, and a control terminal coupled to the complementary data node; and a second pull down transistor including a first current terminal coupled to the second voltage terminal, a second current terminal coupled to the complementary data node, and a control terminal coupled to the data node;

wherein the first true pass transistor is implemented in an active region that does not include the first pull up transistor, the second pull up transistor, the first pull down transistor, and the second pull down transistor;

wherein the first complementary pass transistor is implemented in an active region that does not include the first pull up transistor, the second pull up transistor, the first pull down transistor, and the second pull down transistor;

wherein the second true pass transistor is implemented in an active region that does not include the first pull up transistor, the second pull up transistor, the first pull down transistor, and the second pull down transistor;

wherein the second complementary pass transistor is implemented in an active region that does not include the first pull up transistor, the second pull up transistor, the first pull down transistor, and the second pull down transistor; and wherein:
the first pull up transistor, the second pull up transistor, the first true pass transistor, the second true pass transistor, the first pull down transistor, the second pull down transistor, the first complementary pass transistor, and the second complementary pass transistor are of a first cell of the SRAM; and the first true pass transistor is located in a first active region and the first complementary pass transistor is located in a second active region, wherein within a boundary of the first cell, the first active region and the second active region have the same size and shape.

* * * * *